United States Patent
Yang

(10) Patent No.: US 7,224,070 B2
(45) Date of Patent: May 29, 2007

(54) PLURALITY OF SEMICONDUCTOR DIE IN AN ASSEMBLY

(75) Inventor: Jicheng Yang, Newark, DE (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/852,315

(22) Filed: May 24, 2004

(65) Prior Publication Data

US 2004/0212082 A1     Oct. 28, 2004

Related U.S. Application Data

(62) Division of application No. 09/703,920, filed on Nov. 1, 2000, now Pat. No. 6,759,307.

(30) Foreign Application Priority Data

Sep. 21, 2000   (SG) .............................. 200005397-5

(51) Int. Cl.
*H01L 23/48* (2006.01)
(52) U.S. Cl. .................................................... 257/777
(58) Field of Classification Search ................ 257/777, 257/718, 723, 690; 361/396, 735; 438/455, 438/106, 107, 109, 124, 127, 405, 406; 29/841
See application file for complete search history.

(56) References Cited

U.S. PATENT DOCUMENTS

| | | |
|---|---|---|
| 5,120,678 A | 6/1992 | Moore et al. |
| 5,128,831 A | 7/1992 | Fox, III et al. |
| 5,227,663 A | 7/1993 | Patil et al. |
| 5,258,331 A | 11/1993 | Masumoto et al. |
| 5,266,833 A | 11/1993 | Capps |
| 5,323,060 A | 6/1994 | Fogal et al. |
| 5,434,745 A | 7/1995 | Shokrgozar et al. |

(Continued)

FOREIGN PATENT DOCUMENTS

EP     0 736 903 A2     9/1996

(Continued)

OTHER PUBLICATIONS

"Laminated Memory: A new 3-Dimensional Packaging Technology for MCM," Proceedings of 1994 IEEE Multi-Chip Module Conference, pp. 58-63.

*Primary Examiner*—Lex Malsawma
(74) *Attorney, Agent, or Firm*—TraskBritt, PC

(57) ABSTRACT

The present invention provides methods and apparatus related to preventing adhesive contamination of the electrical contacts of a semiconductor device in a stacked semiconductor device package. The methods and apparatus include providing a first semiconductor device with an adhesive flow control dam located on an upper surface thereof. The dam is positioned between electrical contacts and a substrate attach site on the upper surface of the first semiconductor device. The dam is rendered of a sufficient height and shape to block applied adhesive from flowing over the electrical contacts of the first semiconductor device when a second substrate is mounted onto the upper surface of the first semiconductor device. The semiconductor device package may be encapsulated with the dam in place or with the dam removed. The adhesive flow control dam thus protects the electrical contacts of the first semiconductor device from contamination by excess adhesive, which can result in unusable electrical contacts.

48 Claims, 5 Drawing Sheets

U.S. PATENT DOCUMENTS

| | | | |
|---|---|---|---|
| 5,436,203 A * | 7/1995 | Lin ............................. 29/841 |
| 5,468,997 A | 11/1995 | Imai et al. |
| 5,478,781 A * | 12/1995 | Bertin et al. ................ 438/109 |
| 5,481,133 A | 1/1996 | Hsu |
| 5,481,134 A | 1/1996 | Sobhani et al. |
| 5,530,278 A | 6/1996 | Jedicka et al. |
| 5,612,570 A | 3/1997 | Eide et al. |
| 5,770,478 A | 6/1998 | Iruvanti et al. |
| 5,777,345 A | 7/1998 | Loder et al. |
| 5,790,384 A | 8/1998 | Ahmad et al. |
| 5,804,004 A | 9/1998 | Tuckerman et al. |
| 5,825,087 A | 10/1998 | Iruvanti et al. |
| 5,861,678 A * | 1/1999 | Schrock ...................... 257/783 |
| 5,898,223 A | 4/1999 | Frye et al. |
| 5,923,090 A * | 7/1999 | Fallon et al. ............... 257/777 |
| 5,939,776 A | 8/1999 | Kim et al. |
| 5,952,725 A | 9/1999 | Ball |
| 5,953,588 A | 9/1999 | Camien et al. |
| 5,973,052 A | 10/1999 | Iyer et al. |
| 5,977,640 A | 11/1999 | Bertin et al. |
| 5,982,018 A | 11/1999 | Wark et al. |
| 5,994,166 A | 11/1999 | Akram et al. |
| 5,998,864 A | 12/1999 | Khandros et al. |
| 6,005,778 A | 12/1999 | Spielberger et al. |
| RE36,613 E | 3/2000 | Ball |
| 6,051,878 A | 4/2000 | Akram et al. |
| 6,222,265 B1 | 4/2001 | Akram et al. |
| 6,391,682 B1 * | 5/2002 | Tsai et al. ................... 436/108 |
| 6,400,007 B1 * | 6/2002 | Wu et al. .................... 257/686 |
| 6,404,044 B2 | 6/2002 | Akram et al. |
| 6,759,307 B1 * | 7/2004 | Yang .......................... 438/455 |
| 6,803,646 B2 * | 10/2004 | Shibue ....................... 257/667 |
| 2002/0028533 A1 * | 3/2002 | Tang et al. ................. 438/106 |

FOREIGN PATENT DOCUMENTS

| JP | 8279591 | 10/1996 |
|---|---|---|
| TW | 413875 A | 12/2000 |

* cited by examiner

PLURALITY OF SEMICONDUCTOR DIE IN AN ASSEMBLY

CROSS-REFERENCE TO RELATED APPLICATIONS

This application is a divisional of application Ser. No. 09/703,920, filed Nov. 1, 2000, now U.S. Pat. No. 6,759,307, dated Jul. 6, 2004, which claims foreign priority benefit to Singapore patent application, Serial No. 200005397-5, filed Sep. 21, 2000.

BACKGROUND OF THE INVENTION

Field of the Invention

This invention relates generally to integrated circuit semiconductor device assemblies. More particularly, the present invention relates to stacked arrangements for semiconductor dice in semiconductor device assemblies.

Semiconductor devices are increasingly used in portable electronic applications, necessitating the development of smaller, higher-performance components. In conventional semiconductor manufacturing processes, a multitude of integrated circuit (IC) dice or semiconductor dice is typically fabricated at one time onto a wafer comprising a semiconducting substrate (e.g., silicon or gallium arsenide) through methods well known in the art. These semiconductor dice are then incorporated, in turn, into a system by mounting them on a carrier substrate, for example, a printed circuit board, to interconnect with the rest of the elements of the system, many of which are also other semiconductor dice.

In recent years, semiconductor manufacturing technology has steadily progressed, resulting in ever-increasing numbers of circuit elements placed on a single semiconductor die. Semiconductor wafers are now subjected to thinning processes, resulting in the removal of nearly all excess silicon from individual semiconductor dice. To further decrease the size of the overall packaged system, printed circuit boards and other component supporting substrates are made as small as practicable. For still further increases in electronics density, recent innovations have turned to new ways to package semiconductor dice. One such innovation involves vertically stacking a plurality of horizontally disposed semiconductor dice to form a dense electronic package. By using such stacking arrangements, multiple semiconductor dice can be attached to the system using the footprint area of a single semiconductor die. The resulting increases in density allow for faster signal propagation while providing lower overall device weight. Additionally, these "chip-on-chip or die-on-die" arrangements can often be fabricated faster and more cheaply than by designing new integrated circuitry for substrates.

The lack of available "real estate" on smaller circuit boards makes the stacking of semiconductor dice particularly desirable. One type of stacking arrangement, wherein several bare semiconductor dice used for the same or different functions are mounted in a common package, is known as a multi-chip module (MCM). MCMs generally contain a plurality of semiconductor dice in a dense arrangement where they are packaged together in a supporting substrate that can be hermetically sealed. Although prior art MCMs typically have a number of individual semiconductor dice mounted within the package in a laterally adjacent manner, the vertical stacking of semiconductor dice is increasingly gaining acceptance.

Many types of semiconductor dice can be used to form MCM chip-on-chip or die-on-die stacks, including dynamic random access memory (DRAM), static random access memory (SRAM) and FLASH memory chips, as well as semiconductor dice having other types of functions such as analog-to-digital convertor (ADC) semiconductor dice, microprocessors, and field programmable gate arrays (FPGAs). Typically, the stacked semiconductor dice have electrical contacts which are coupled in common or in parallel to contacts on the substrate board.

In early MCM stacking arrangements, single stacks of semiconductor dice were generally made using semiconductor dice having substantially equal dimensions. For example, in U.S. Pat. No. 5,323,060, assigned to the assignee of the present application, a plurality of identical, vertically stacked semiconductor dice is disclosed with a relatively thick adhesive layer interposed therebetween. The active circuitry of the horizontally disposed semiconductor dice is shown facing upwardly, with wirebonds from each semiconductor die extending downwardly from the active surface to contact pads onto a multi-chip module substrate.

In the case of memory semiconductor dice, vertical stacking proves particularly advantageous since a plurality of semiconductor dice could be used to multiply the amount of memory available. Illustrative of the prior state of the art in this regard is "*Laminated Memory: A new 3-Dimensional Packaging Technology for MCM,*" Proceedings of 1994 IEEE Multi-Chip Module Conference, pp. 58–63.

More recently, single stacks have been made comprised of semiconductor dice of different sizes and/or functions directly attached to one another. Generally, one or more semiconductor dice are bonded on top of a larger semiconductor die, although larger semiconductor dice have been placed on smaller semiconductor dice using various ball grid array connections and various interposers as shown in U.S. Pat. Nos. 5,977,640 and 5,790,384, respectively.

Numerous packaging alternatives for stacked dice are found in the art. In U.S. Pat. No. 5,777,345, an integrated circuit package is disclosed wherein a first semiconductor die (a microprocessor) is attached to a die paddle of a lead frame, and a second smaller semiconductor die (a memory chip) is directly attached to the upwardly facing active surface of the first semiconductor die. The bonding pads of the semiconductor dice are shown to be connected to each other, and to the lead frame, by a wire bonding process.

U.S. Pat. No. 5,998,864 discloses horizontally disposed bare semiconductor dice stacked atop one another in offset fashion such that an edge portion of each semiconductor die is exposed. On the edge portions of each semiconductor die are terminals (bond pads) for interconnection of the semiconductor dice to an interconnection substrate.

U.S. Pat. No. 6,005,778 shows semiconductor die stacking arrangements wherein a planar silicon spacer with a conductive surface and upwardly facing bond pads is mounted between two semiconductor dice on a substrate carrier. The planar conductive spacer is shown with two configurations. In a first configuration, the intermediately disposed spacer has a two-tiered portion at its lateral edges, with bond pads exposed on the lower of the two tiers. The spacer is further provided with lesser horizontal dimensions than the first semiconductor die, such that the two lateral edges of the first semiconductor die, containing bond pads for wire bonding to the substrate, remain exposed after the spacer is adhesively affixed to the first semiconductor die. In a second embodiment, the planar spacer has a larger footprint than the horizontally disposed semiconductor dice used in the assembly. The spacer is placed intermediate to the two smaller semiconductor dice such that lateral edge upper surface areas of the spacer, containing bond pads and wire bonds, extend beyond the footprints of both semiconductor dice. The second semiconductor die, also containing wire bonds on its upper surface lateral edges, is bonded to the spacer by an adhesive layer, leaving the bonding pads and wire bonds of the spacer exposed.

In these types of stacked semiconductor die arrangements, the semiconductor dice are typically bonded to each other, or to intermediately disposed spacers/interposers, by means of an adhesive layer. Typically, bare semiconductor dice are attached to such substrates using organic-based adhesives. The adhesive layer is typically dispensed automatically by screen printing, by a stamping device, or by a needle or syringe, in a non-cured state (soft phase), and is deposited in a predetermined area designated for the mounting of the semiconductor die (i.e., the die attach area). Meanwhile, the semiconductor die to be mounted is then typically picked up and held by an automated vacuum mechanism, or other apparatus, of a die bonding machine. The semiconductor die is then positioned over the center of the die attach area and is pressed into the previously deposited adhesive, ideally forming a uniform layer of adhesive under the semiconductor die. Usually, the adhesive layer is thereafter brought to its cured phase through exposure to elevated temperatures for a specified time period.

In many adhesive compositions, the carrier material, which provides the adhesion and mechanical strength in the bond line, is a polyimide or an epoxy resin. The carrier can be filled with metal particles in the event electrical and thermal conductivity is required. Alternatively, the carrier can be filled with nonmetallic particles, such as alumina, if the final bond is to act as an insulator.

One problem associated with the application of die attach adhesives is that an amount of a particular adhesive must be satisfactorily dispensed in a particular thickness and over a particular area which will provide sufficient bond integrity for the application while simultaneously being free from voids. Voids are a problem for several reasons. First, if a void appears directly under an active part of a power circuit, the junction temperature may rise significantly since there is no material available to pull away the heat. Second, and more obviously, voids can affect the quality and mechanical strength of the die attach itself. Thus, the distribution of voids across the adhesive bonding layer is important in determining the effects which they will have. Small, random voids have only a modest effect on the thermal performance and mechanical integrity of the attach. Large, contiguous voids, however, can be catastrophic to both thermal and mechanical performance. Voids can also serve as sites for moisture to collect during storage. This is especially problematic in plastic packages since this moisture can spread to critical interfaces and cause delaminations and package cracking. Care must be taken, therefore, to ensure a sufficient amount of a properly viscous adhesive is applied to the die attach site so that void formation is minimized.

A related problem is that the adhesive, when dispensed, may overflow the site for semiconductor die or spacer/interposer attachment, or the adhesive may be squeezed out too far when the semiconductor die or spacer/interposer to be mounted is pressed into it. In the situation of vertically stacked semiconductor dice, this overflow or excess of adhesive can lead to the contamination of nearby bond pads, consequently interfering with subsequent wire bond operations, or even resulting in the loss of the function of the semiconductor die.

An associated phenomenon pertains to the use of conductive silver-filled epoxies for the bonding of silicon semiconductor dice, a well-established procedure in the microelectronics industry. One of the problems that has plagued the industry in the past is the separation or "bleeding out" of the resin vehicle from the epoxy. In some cases, this resin bleed is severe enough to interfere with subsequent wire bonding and lid sealing operations by disadvantageously coating the surfaces with a thin film of the resin material.

The rheology (also referred to as viscosity) of adhesives is therefore a property which is critical to proper die attach processes. Viscosity can be a difficult property to control, and may be affected by even small changes in the ambient temperature. Different application methods for adhesive also have different viscosity ranges. For example, viscosity ranges typical for dispensing are from about 20,000 to about 60,000 centipoise (cps), from about 8,000 to about 20,000 cps for stamping, and from about 30,000 to about 100,000 cps for screen printing.

Therefore, when attaching vertically stacked semiconductor dice, it would be advantageous to develop a method and assembly for preventing adhesive overflow which can potentially lead to bond pad contamination. Such a method and assembly should ideally be simple, inexpensive, and compatible with widely practiced means of fabricating stacked semiconductor die package assemblies. Additionally advantageous would be a method which allows for relaxed requirements for die attach materials and process controls.

BRIEF SUMMARY OF THE INVENTION

The present invention relates to a method and assembly for preventing adhesive overflow contamination of bond pads during the attachment of stacked semiconductor dice. The method and assembly comprise building or placing an adhesive flow control dam positioned between an adhesive application area and electrical contacts on an upper surface of a first semiconductor die. A second semiconductor die or other substrate is mounted (i.e., stacked) onto the adhesive application area of the first semiconductor die. In accordance with the invention, the adhesive flow control dam is rendered of a sufficient height and shape to block applied adhesive from flowing over the electrical contacts of the first semiconductor die when the second substrate is mounted onto the upper surface of the first semiconductor die. The mounting surface of the semiconductor die stack may be supplied with a thermally and/or electrically conductive adhesive, which holds the stack together in addition to allowing for heat dissipation and providing the necessary electrical interconnection between mounted chips, respectively. The semiconductor die stack may also be mounted on a carrier substrate.

In another embodiment, two stacked semiconductor dice may be separated by a semiconducting interposer or other substrate. The interposer is adhesively attached to the upper surface of the first semiconductor die, while a second semiconductor die is attached to the upper surface of the interposer. An adhesive flow control dam positioned in the region between the perimeter of the interposer and the electrical contacts or bond pads of the first semiconductor die prevents adhesive from flowing over the electrical contacts.

In another embodiment, the method of the present invention may be used when the two semiconductor dice are of the same or substantially similar size. The semiconductor dice can be mounted in an offset fashion relative to one another, leaving the edge portions of the semiconductor dice containing electrical contacts exposed. An adhesive flow control dam is located on a first semiconductor die between the electrical contacts and the die attach site. In addition, the dice may be mounted directly one above the other, wherein an adhesive flow control dam located on the terminal area portions of each semiconductor die is configured to deform when the mounting semiconductor die is pressed into it.

In another embodiment, the adhesive flow control dam can serve as a decoupling capacitor or a decoupling capacitor coupon. The decoupling capacitor coupon is electrically connected to the surface of the first semiconductor die to lower noise and to improve inductive impedance.

In a further embodiment, the dam of the present invention can be used to accumulate thermally conductive adhesive on a constrained region of the semiconductor die in addition to preventing overflow of adhesive onto the electrical bond pads. The thermally conductive adhesive provides increased thermal dissipation of heat from the semiconductor die.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
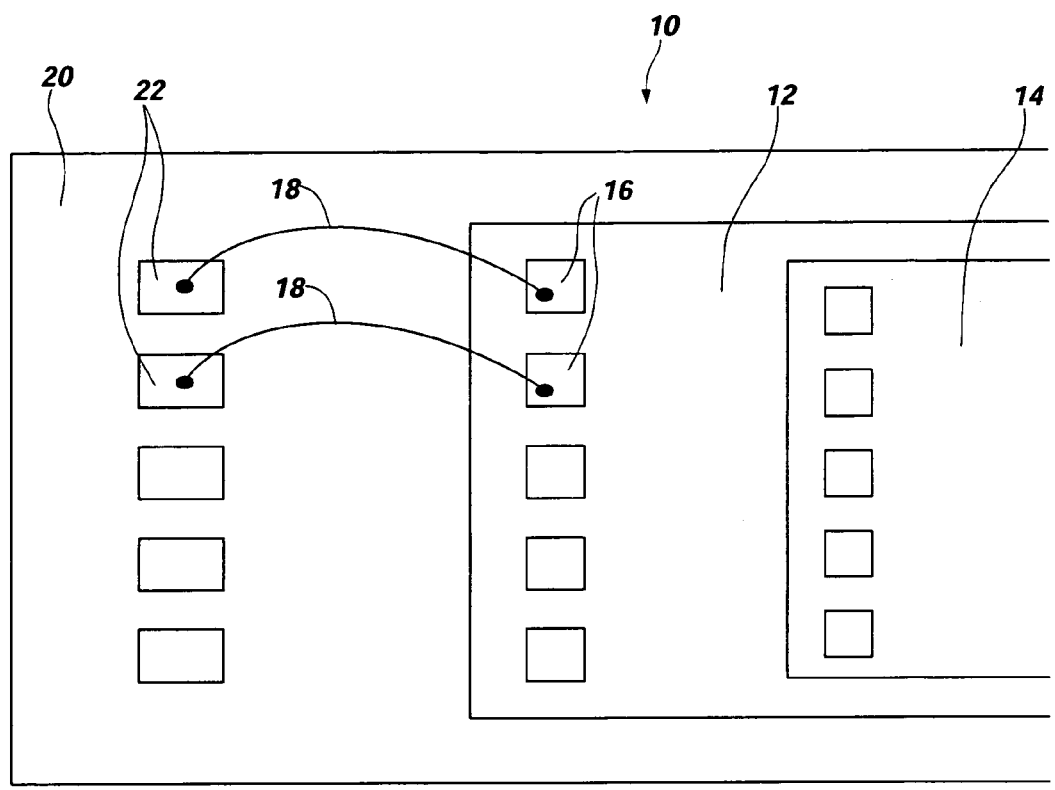
FIG. 1 illustrates an example of a prior art stacked semiconductor die package.

Illustrated in drawing FIG. 1 is an example of a prior art vertically stacked integrated circuit semiconductor die package 10 contemplated for use in the method and assembly of the present invention. Package 10 comprises a first, large semiconductor die 12 and a second, smaller semiconductor die 14 which are horizontally disposed upon a carrier substrate 20, the bare semiconductor dice mounted in a face-to-back configuration relative to one another. Large semiconductor die 12 and smaller semiconductor die 14 are provided with wire bonding bond pads 16 exposed on two edges of an active surface of both dice (only one edge is shown), and with wire bonds 18 extending to bond pads 22 on the carrier substrate 20. Bond pads 16 may also be configured as any of a variety of contact pads typically used for the electrical interconnection of substrates. Under the die attach area of smaller semiconductor die 14, an adhesive material 13 (not shown) is provided which serves to bond large semiconductor die 12 and smaller semiconductor die 14 together. The adhesive layer may be formed of any type die attach material known in the art, including polymers such as polyimides, polyamides, epoxies, cyanate esters, silicones and acrylics (including UV curable), as well as gels, pastes, solders, various other electrically or thermally conductive adhesives, and the like. Semifluid adhesives may be used, as well as fluid-like adhesives with relatively little resistance to flow. Use of thermally and electrically conductive adhesives are preferable in some applications; a thermally conductive adhesive allows large semiconductor die 12 and smaller semiconductor die 14 to operate at substantially the same temperatures, while an electrically conductive adhesive allows the stacked dice to have the same ground potentials. Adhesive material 13 can be deposited by any means known in the art, including, but not limited to, screen printing, stenciling, stamping, rolling on, spraying on, or by use of a needle or syringe. Preferably, adhesive material 13 has a relatively high coefficient of thermal expansion and/or electrical conductivity to improve the thermal and/or electrical efficiency of package 10, depending on the particular application.

In the embodiment shown in drawing FIG. 1, the first semiconductor die 12 is an SRAM die while the second semiconductor die 14 is a FLASH memory die. The first semiconductor die 12, however, may be of any variety of semiconductor die known in the art, including, but not limited to: microprocessors, DRAM, SRAM, FLASH, ADC, FGPA, active pixel sensors (APS), operational amplifiers (op AMP), etc. The smaller second semiconductor die 14 may also be of any variety known in the art, including a semiconductor die that serves the same or a similar function to that of large semiconductor die 12, the only qualification of this embodiment being that smaller second semiconductor die 14 is smaller than large semiconductor die 12.

Figure 2:
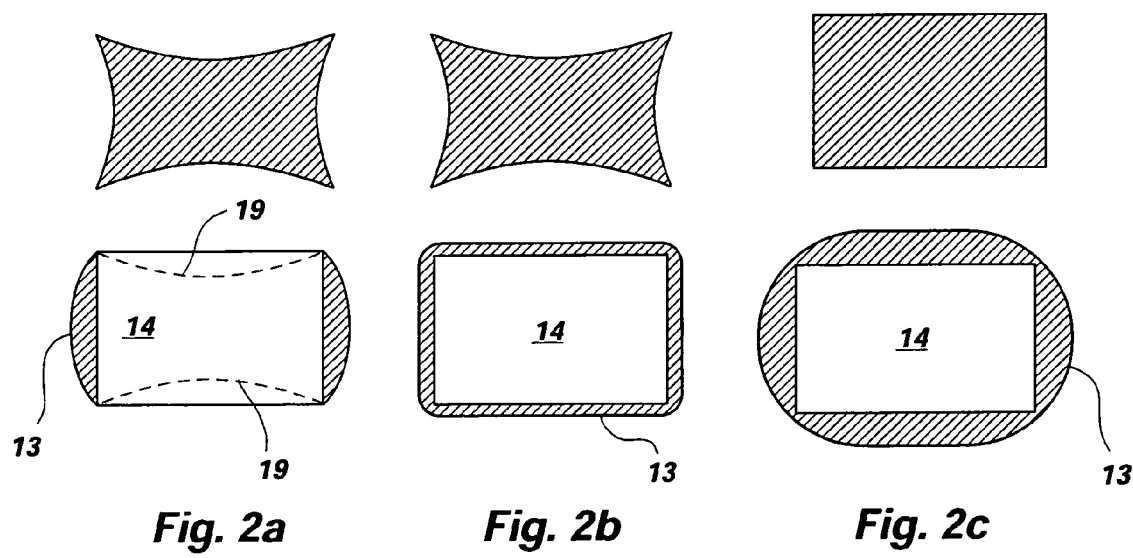
FIG. 2a shows a stacked semiconductor die package with less than a sufficient amount of adhesive under the mounting semiconductor die, thus resulting in the undesirable formation of voids.
FIG. 2b illustrates a stacked semiconductor die package with the correct amount of adhesive applied under the mounting semiconductor die.
FIG. 2c illustrates a stacked die package wherein an excess of adhesive has been applied under a mounting semiconductor die.

Illustrated in drawing FIGS. 2a, 2b, and 2c are top views of smaller semiconductor die 14 mounted atop a larger semiconductor die 12 by means of a previously dispensed layer of adhesive. Larger semiconductor die 12 is configured with bond (or electrical contact) pads 16 on lateral edges. In drawing FIG. 2a, semiconductor die 14 is shown with less than a sufficient amount of adhesive thereunder, resulting in the undesirable formation of voids 19. Illustrated in drawing FIG. 2b is the correct amount of adhesive dispensed, while drawing FIG. 2c illustrates the application of too much adhesive. Above each figure is a top view of adhesive material 13 shown as it would appear prior to the attachment of semiconductor die 14, the adhesive deposited in this case by a stamping tool. Illustrated in drawing FIG. 2c is the deposit of adhesive where the deposit of adhesive is the same size as the semiconductor die. The mounting of a semiconductor die or substrate may cause adhesive material to be squeezed out sufficiently such that the adhesive material 13 is forced outside the perimeter of the semiconductor die and onto bond pads 16, of larger semiconductor die 12. The contamination potentially renders the bond pads unusable. As shown in drawing FIGS. 2b and 2c, adhesive material 13 may also be forced from the perimeter edges of semiconductor die 14 and in the vicinity or onto bond pads 16, dependent upon the viscosity of the adhesive material 13.

As shown in drawing FIG. 3, dam or barrier 30 (hereinafter referred to as dam 30) is provided or formed on an upper surface of large semiconductor die 12. Dam 30, which is an adhesive flow control dam, is formed in situ or is manufactured and then preplaced and adhered on large semiconductor die 12 prior to die attach. Dam 30 is positioned in a region on the upper die surface between the area for die attach adhesive application and bond pads 16. Dam 30 may be a polyimide, epoxy, polyamide or other type strip, as well as a cured liquid or other type of physical barrier. When formed in situ, dam 30 may be formed on a wafer or a semiconductor die through any of a variety or combination of deposition techniques well known in the art, including sputtering, CVD, PVD, and photoimaging techniques. Dam 30 may also be preformed or formed in place by casting techniques. Dam 30 is configured with lateral dimensions and a predetermined height, shape, and viscosity so as to prevent the flow of adhesive material 13 onto bond pad 16 when smaller semiconductor die 14 is mounted onto larger semiconductor die 12. By preventing the flow of adhesive material 13 onto bond pads 16, the bond pads 16 are protected from "contamination" by the adhesive material, which could potentially render the bond pads unusable. It is understood that use of the term "contamination" refers to any contact of adhesive material 13 to bond pads 16. It is contemplated that dam 30 may be placed in any location on semiconductor die 12 wherein the potential exists for adhesive overflow onto bond pads 16 or other electrical structures of semiconductor die 12.

Figure 3:
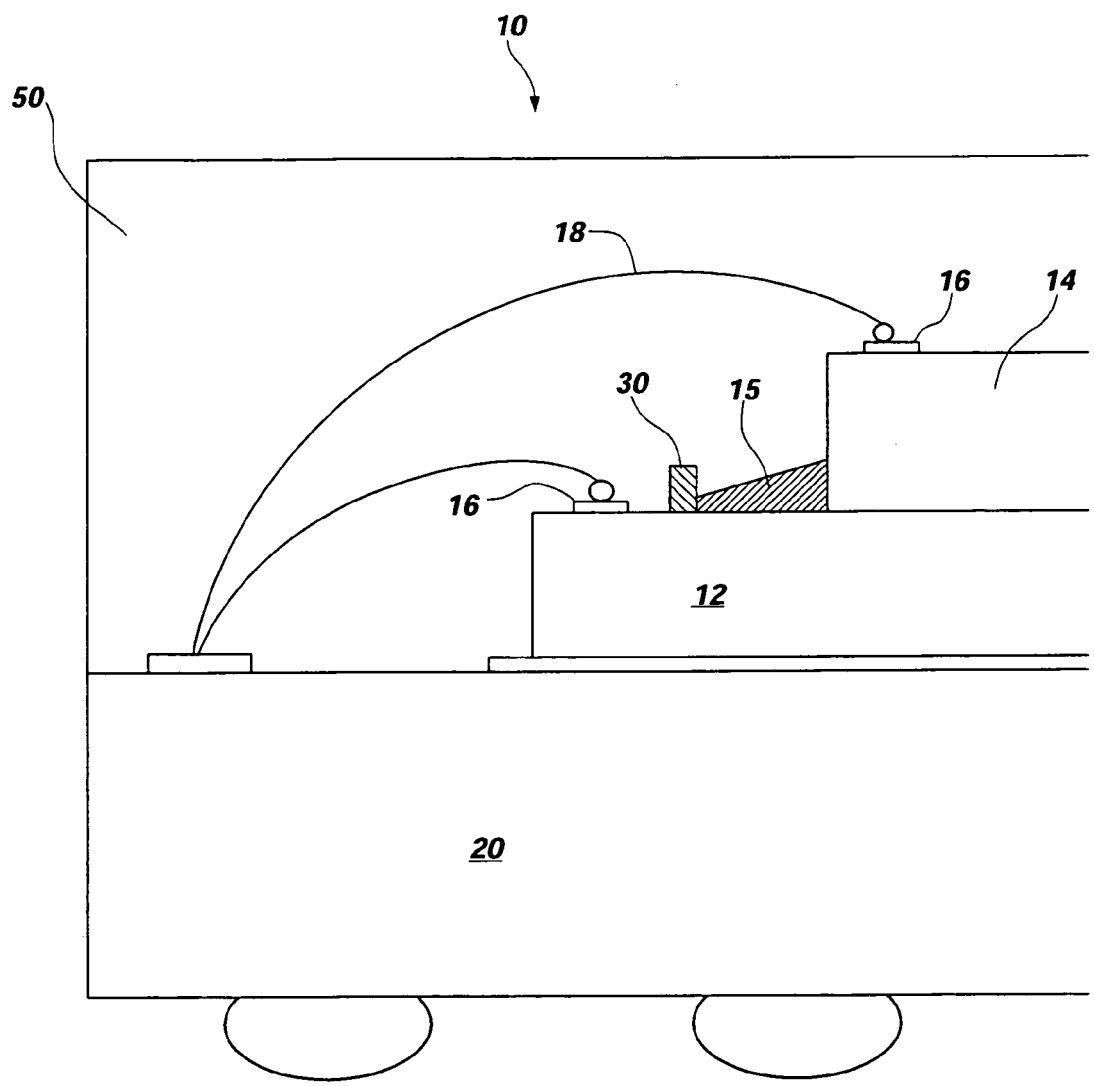
FIG. 3 shows a side view of a stacked semiconductor die package which makes use of an adhesive flow control dam to prevent the flow of semiconductor die attach adhesive onto electrical contacts of a first semiconductor die.

Illustrated in drawing FIG. 3 is an overflow 15 of adhesive material 13 of the kind the invention is designed to protect, resulting, for example, from the dispensing of a low-viscosity adhesive, from the inaccurate placement of adhesive, or from an excess of adhesive squeezed out from the die edges during the mounting of smaller semiconductor die 14 onto the die attach area of large semiconductor die 12. Once die attach has been accomplished using dam 30, stacked semiconductor die package 10 may be encapsulated by means known in the art to protect package 10, as well as its related interconnections, from moisture, contamination, etc. Dam 30 may remain in place during encapsulation. Alternatively, dam 30 can be removed prior to the encapsulation process. Typically, encapsulant 50 is an electrically insulating material which prevents electrical shorting of bond pads 16 and wire bonds 18. In a preferred embodiment, dam 30 is made of a material which is the same, or substantially similar to, the material which forms encapsulant 50.

Figure 4:
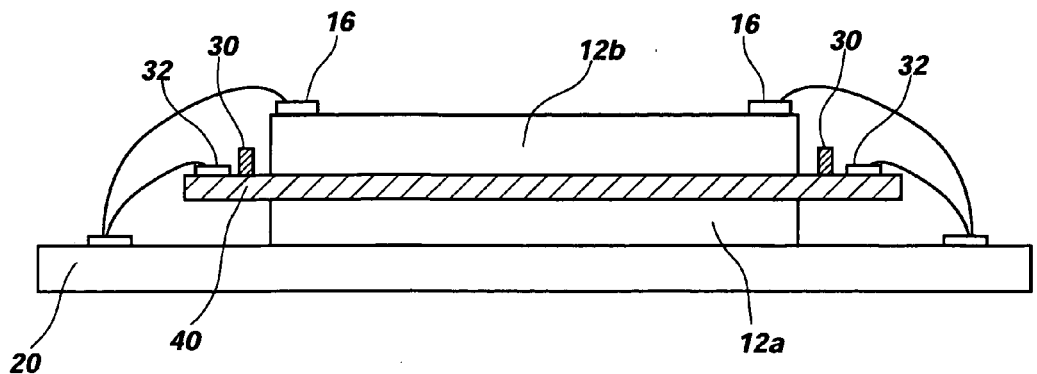
FIG. 4 shows a side view of an embodiment of a stacked semiconductor die package wherein a semiconducting interposer is intermediately disposed between two semiconductor dice.

Illustrated in drawing FIG. 4 is an alternate embodiment of a package 10 wherein a semiconducting interposer 40 is intermediately disposed between two semiconductor dice 12a and 12b. Interposer 40 is mounted onto an upper surface of first semiconductor die 12a, the upper surface of semiconductor die 12a containing bond pads at its lateral edges. A second semiconductor die 12b, which is shown as approximately the same size as semiconductor die 12a, is adhesively mounted on a top surface of interposer 40. Interposer 40, which preferably comprises a conductive substrate, is formed of dimensions less than the footprint of semiconductor die 12a such that bond pads 16 of semiconductor die 12a remain exposed. Interposer 40 is adhesively attached on top of semiconductor die 12a by a layer of adhesive material 13 as described above. Dam 30 is shown positioned in the region between a perimeter edge of interposer 40 and bond pads 16 of semiconductor die 12a so as to block an overflow of adhesive material 13 onto bond pads 16.

It is also contemplated that dam 30 may be used when interposer 40 is formed as a semiconductor substrate with bond pads 32 disposed thereon. In this alternate embodiment, interposer 40 is intermediate to two stacked and horizontally disposed dice. As seen in drawing FIG. 4, interposer 40 is configured with a footprint larger than that of top die 12b (FIG. 4). A dam 30 is positioned in the region between a perimeter edge of semiconductor die 12b and bond pads 32 of interposer 40 such that die attach adhesive material 13 does not overflow onto bond pads 32 during die attach processes.

Figure 5A:
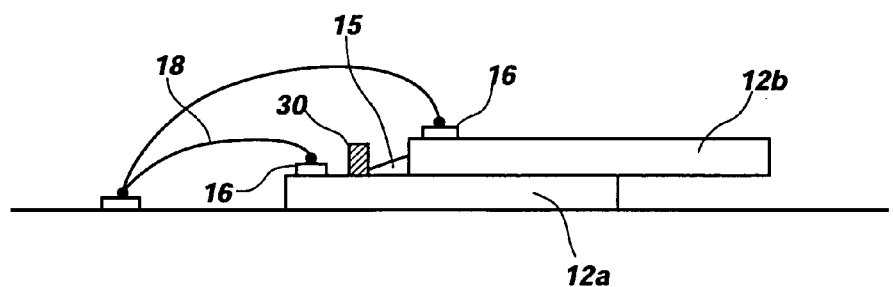
FIG. 5a illustrates an embodiment of the present invention wherein an adhesive flow control dam may be used when semiconductor dice are stacked in an offset fashion relative to one another.

Dam 30 can also be used when stacked dice are of the same or approximately the same size. As shown in drawing FIG. 5a, semiconductor dice 12a and 12b are mounted in an offset fashion similar to or the same as that disclosed in U.S. Pat. No. 5,998,864. In this configuration, bare semiconductor dice are stacked atop one another in offset fashion such that an edge portion of each semiconductor die, containing bond pads 16, is exposed. A dam 30 can be formed between each of the semiconductor die attach sites and bond pads 16 to prevent contamination resulting from adhesive overflow.

Figure 5B:
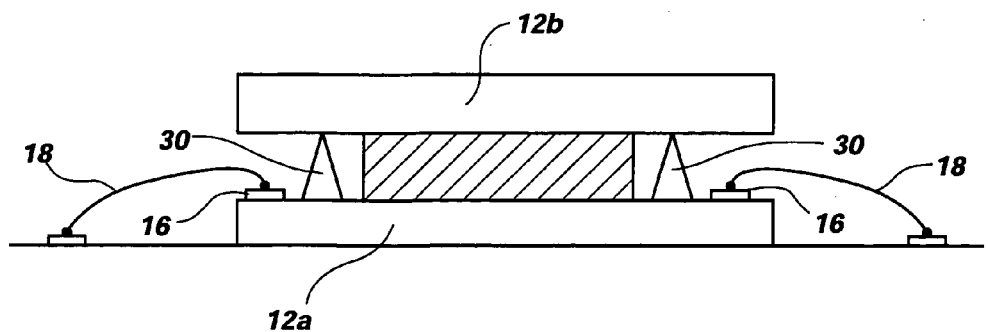
FIG. 5b illustrates an embodiment wherein a mounted semiconductor die is placed in contact with an adhesive flow control dam of the present invention.

In drawing FIG. 5b, semiconductor dice 12a and 12b, of the same or similar size, are shown in a stacked arrangement, mounted directly above one another, with a relatively thick layer of adhesive placed therebetween. Such a stacked arrangement is described in U.S. Pat. No. 5,323,060, assigned to the assignee of the present application. Dams 30, formed of a height, length, and other dimensions so as to effectively block the flow of the thick layer of adhesive material 13, may be placed in the terminal area portions on lateral edges of each semiconductor die to prevent contamination of bond pads 16. In a preferred embodiment of this arrangement, dams 30 are preformed on an upper surface of semiconductor die 12a in a peaked shape. When semiconductor dice 12a, 12b are pressed together to form a vertically stacked package 10, peaked dams 30 are of a height and material so as to deform, thus providing support for the "overhang" regions of the stacked dice arrangement to protect the dice against structural damage. As an additional advantage, peaked dams 30, when deformed by the mounting of semiconductor dice 12a, 12b, form a complete barrier to the passage of excess adhesive material 13, consequently providing increased protective capacity and insulation for bond pads 16. As is apparent to one of ordinary skill in the art, the peaked dam structure of this embodiment has further application in other types of mounting arrangements, such as the interposer/die stack arrangement shown in drawing FIG. 4.

Figure 6:
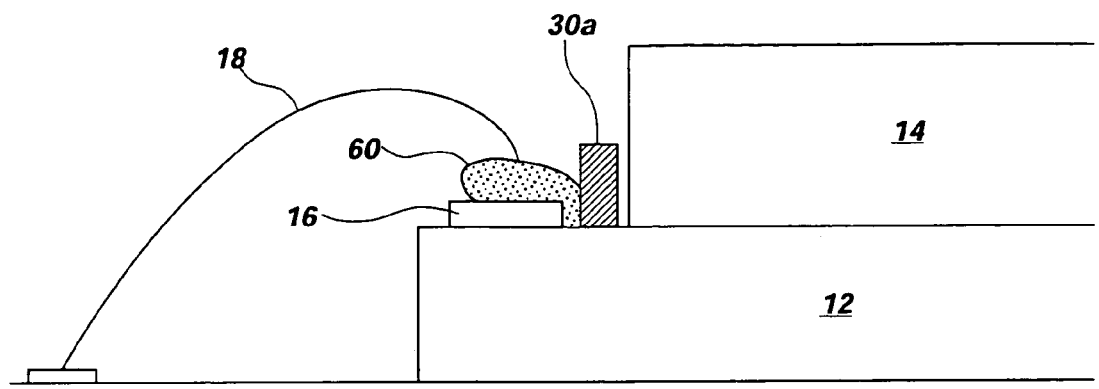
FIG. 6 illustrates an adhesive flow control dam of the present invention used to prevent solder flow from wire bonding operations from contacting a mounted semiconductor device.

In another embodiment, dam 30 can be formed to serve an additional function as a decoupling capacitor or a decoupling capacitor coupon. A decoupling capacitor coupon dam 30a, as used herein, is defined as a relatively thin capacitive structure which is sufficiently thin so as to minimize any associated height increase to the semiconductor die to which it is mounted. Such a decoupling capacitor is the subject of U.S. Pat. No. 5,982,018, assigned to the assignee of the present invention. Illustrated in drawing FIG. 6 is an example of a decoupling capacitor coupon dam 30a placed near a proximate edge region of larger semiconductor die 12 such that it also functions as a dam 30, preventing die attach adhesive material 13, used for the attachment of smaller semiconductor die 14, from contaminating bond pads 16 on larger semiconductor die 12. Decoupling capacitor coupon dam 30a is electrically connected to the active surface of semiconductor die 12 (or other substrates) by conventional methods known in the art. The decoupling capacitor coupon dam 30a comprises at least two electrode plates with a dielectric film disposed therebetween. Such coupons are useful in lowering noise by providing a path to ground for high frequency signals and, when positioned in close proximity to a chip, demonstrate an improved inductive impedance. Decoupling capacitor coupon dam 30a may be preformed of layers of conductive foil and dielectric, such as a polyimide tape, and dispensed from a stack or a reel for placement on a carrier substrate, in which case the coupon may be provided with a preplaced adhesive (conductive or non-conductive, as required) for affixation of each coupon to a semiconducting substrate or die in accordance with the uses specified by the present invention. Alternatively, decoupling capacitor coupon dam 30a may be formed adjacent future die bond pad regions during fabrication of semiconductor dice on a wafer or other semiconductor substrates by deposition or application of the electrode and dielectric layers to the wafer prior to singulation of the dice therefrom. Preferably, the decoupling capacitor coupon dam 30a is used in combination with an insulating die attach adhesive material 13. To prevent electrically shorting decoupling capacitor coupon dam 30a, die attach adhesive material 13 should not be electrically conductive.

In addition to preventing bond pad contamination from die attach adhesive, use of dam 30 has several other distinct advantages. First, the protective aspect of dam 30 allows relaxed requirements for die attach materials and process controls. For example, lower viscosity adhesives can be used in the various dispensing operations. Additionally, the dispensing process controls need not be as precise, allowing for less expensive and higher throughput die attach procedures. Furthermore, in applications where tight tolerances between stacked chips are required, dam 30 may secondarily prevent the overflow of solder from bond pads 16 (during wire bonding or other operations) onto a surface or conductive extension of stacked semiconductor die 14, thus preventing electrical shorts. Illustrated in drawing FIG. 6 is this secondary preventive function of decoupling capacitor coupon dam 30a. In drawing FIG. 6, an excess of solder 60 is controlled from reaching surface areas or conductive extensions of semiconductor die 14 by the flow control properties of decoupling capacitor coupon dam 30a. Preferably, this embodiment entails rendering semiconductor die 14 from a material or composition of materials which have dielectric characteristics.

An additional advantage is realized when die attach adhesive material 13 is thermally conductive. During their operation, chips dissipate electrical power as heat. Fluctuations in heat caused by the powering on and off of semiconductor dice are known to cause considerable mechanical stresses on semiconductor die interconnecting arrangements and mountings. Furthermore, where semiconductor dice are stacked one atop the other, it is difficult to dissipate the heat generated by the semiconductor dice in the middle of the stack. Thus, a design challenge for stacked semiconductor dice assemblies is to withstand thermal expansion during operation, and the substantial contraction that occurs when operation ceases. Moreover, there has been a need for semiconductor die assemblies which provide enhanced heat dissipation, particularly from semiconductor dice in the middle of a stack. Dam 30, when used in conjunction with a thermally conductive die attach adhesive, helps solve this problem.

Figure 7:
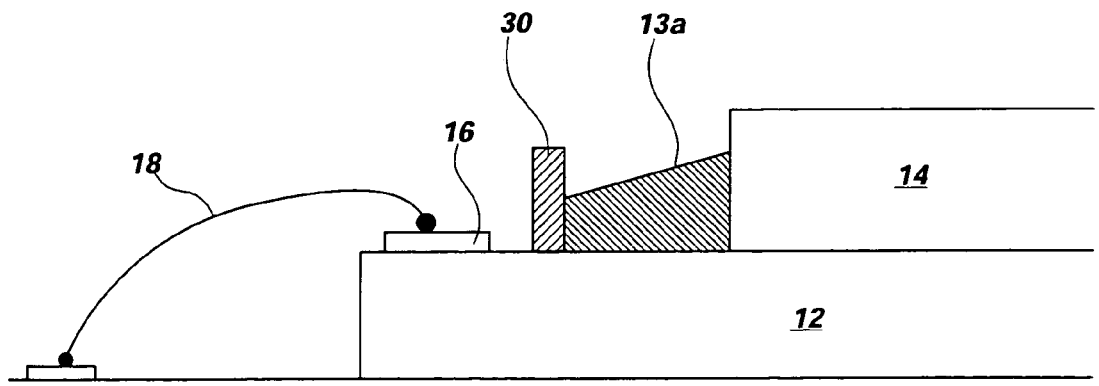
FIG. 7 illustrates an embodiment in which a thermally conductive adhesive is disposed adjacent an adhesive flow control dam for added heat dissipation.

As shown in drawing FIG. 7, thermally conductive adhesive 13a is suitably viscous and/or is placed onto and around the die attach area in such a manner so as to be in contact with, or to flow outwardly towards, dam 30, where it is restrained from contaminating the bond pads 16. The surface area provided by the overflow of thermally conductive adhesive 13a provides increased thermal dissipation of heat from semiconductor dice 12 and 14. In this embodiment, dam 30 may protect contamination of bond pads 16 or, alternatively, may be used on the upper surface of a stacked semiconductor die wherein the upper surface does not contain bond pads, such as in stacked die arrangements with one or more BGA dice, to allow for an accumulation of thermally conductive adhesive 13a. Preferably, thermally conductive adhesive 13a is comprised of an Ag-filled polymer. Other adhesive polymers are also contemplated for use, including nonelectrically conductive polymers, such as alumina-filled polymers, in applications where bond pads 16 or other electrically conductive parts of vertically stacked package 10 are in danger of electrically shorting due to the close proximity of thermally conductive adhesive 13a. In carrying out this embodiment, dam 30 may be formed of a predetermined height which is relatively taller than other dam embodiments disclosed by the present invention, the height configured to provide sufficient protection for bond pads 16 due to increased risk of contamination by an intentionally applied excess amount of thermally conductive adhesive 13a. In an alternative embodiment, a thermal gel is used as the thermally conductive adhesive 13a.

It will be appreciated by those skilled in the art that the embodiments herein described, while illustrating certain embodiments, are not intended to so limit the invention or the scope of the appended claims. For example, this invention, while being described with reference to a dam or barrier for the protection of adhesive contamination of bond pads during die attach, has applicability for the protection of other electrical components which may be attached to a semiconductor die, including traces, contact pads, solder balls, mounting recesses, electrical plugs, etc. Those skilled in the art will also understand that various combinations or modifications of the preferred embodiments could be made without departing from the scope of the invention.

What is claimed is:

1. A plurality of semiconductor die for an assembly comprising:

a first semiconductor die of a plurality of semiconductor die in a wafer, the first semiconductor die having an upper surface, the upper surface comprising a plurality of electrical contacts and at least one region for mounting a second semiconductor die;

at least one adhesive flow control dam formed on the first semiconductor die when a plurality of semiconductor die are in a wafer form prior to the singulation of the plurality of semiconductor die from the wafer for preventing flow of an adhesive applied in the at least one region of the first semiconductor die onto the plurality of electrical contacts during the mounting of a second semiconductor die, the at least one adhesive flow control dam positioned between the at least one region for mounting a second semiconductor die and each electrical contact of the plurality of electrical contacts; and a second semiconductor die, the second semiconductor die adhesively mounted onto the at least one region for the mounting a second semiconductor die of the first semiconductor die.

2. The plurality of semiconductor die of claim 1, further comprising an encapsulant surrounding at least a portion of surface area of the first semiconductor die and the second semiconductor die.

3. The plurality of semiconductor die of claim 1, further comprising a carrier substrate, the first semiconductor die being disposed on the carrier substrate.

4. The plurality of semiconductor die of claim 1, further comprising a mounting adhesive disposed on at least a portion of a region of the upper surface of the first semiconductor die, at least a portion of the mounting adhesive disposed between the at least one adhesive flow control dam and the second semiconductor die.

5. The plurality of semiconductor die of claim 4, wherein the mounting adhesive is configured to be thermally conductive having an exposed surface area being heat dissipative.

6. The plurality of semiconductor die of claim 5, wherein the mounting adhesive comprises an Ag-filled polymer.

7. The plurality of semiconductor die of claim 4, wherein the mounting adhesive is configured to have a coefficient of thermal expansion selected from a group consisting of a coefficient of thermal expansion of the first semiconductor die, a coefficient of thermal expansion of the second semiconductor die, and an average of the coefficients of thermal expansion of the first semiconductor die and the second semiconductor die.

8. The plurality of semiconductor die of claim 1, wherein the at least one adhesive flow control dam comprises at least one decoupling capacitor coupon.

9. The plurality of semiconductor die of claim 8, wherein an adhesive used to mount the second semiconductor die includes an electrically insulating adhesive.

10. The plurality of semiconductor die of claim 1, wherein the at least one adhesive flow control dam comprises a material selected from a group consisting of polyimides, polyamides, and epoxies.

11. The plurality of semiconductor die of claim 1, wherein the at least one adhesive flow control dam includes a flow control dam more viscous than an adhesive used to adhesively mount the second semiconductor die.

12. The plurality of semiconductor die of claim 1, wherein the first semiconductor die is larger than the second semiconductor die.

13. The plurality of semiconductor die of claim 1, wherein the first semiconductor die is substantially the same size as the second semiconductor die.

14. The plurality of semiconductor die of claim 1, wherein the first semiconductor die comprises an integrated circuit semiconductor die.

15. The plurality of semiconductor die of claim 1, wherein the second semiconductor die comprises an integrated circuit semiconductor die.

16. The plurality of semiconductor die of claim 14, wherein the integrated circuit semiconductor die is selected from a group consisting of microprocessors, DRAM, SRAM, FLASH, ADC, FGPA, an active pixel sensor, and an operation amplifier.

17. The plurality of semiconductor die of claim 15, wherein the integrated circuit semiconductor die is selected from a group consisting of microprocessors, DRAM, SRAM, FLASH, ADC, FGPA, an active pixel sensor, and an operation amplifier.

18. The plurality of semiconductor die of claim 1, wherein the first semiconductor die comprises an interposer.

19. The plurality of semiconductor die of claim 1, wherein the second semiconductor die is mounted in an offset fashion relative to the first semiconductor die.

20. The plurality of semiconductor die of claim 1, wherein at least a portion of the second semiconductor die is in contact with the at least one adhesive flow control dam.

21. The plurality of semiconductor die of claim 20, wherein the at least one adhesive flow control dam is configured to deform upon the contact with the second semiconductor die.

22. The plurality of semiconductor die of claim 1, wherein the at least one adhesive flow control dam extends substantially across an entire width of the first semiconductor die.

23. The plurality of semiconductor die of claim 1, further comprising at least one wire bond extending from at least one electrical contact of the plurality of electrical contacts.

24. The plurality of semiconductor die of claim 23, wherein the at least one adhesive flow control dam is further configured to prevent solder flow onto at least a portion of the second semiconductor die or an extension thereof during wire bonding of at least one electrical contact of the plurality of electrical contacts.

25. A stacked semiconductor die assembly comprising:
a first semiconductor die of a plurality of semiconductor die in a wafer, the first semiconductor die having an upper surface including a plurality of electrical contacts, at least one region for mounting a second semiconductor die, and at least one adhesive flow control dam formed on the first semiconductor die when a plurality of semiconductor die are in a wafer form prior to the singulation of the plurality of semiconductor die from the wafer for preventing flow of an adhesive from the at least one region onto the plurality of electrical contacts during the mounting of a second semiconductor die on the first semiconductor die, the at least one adhesive flow control dam positioned between the at least one region for mounting a second semiconductor die and each electrical contact of the plurality of electrical contacts; and
a second semiconductor die, the second semiconductor die adhesively mounted onto the at least one region for the mounting a second semiconductor die of the first semiconductor die.

26. The stacked semiconductor die assembly of claim 25, further comprising an encapsulant surrounding at least a portion of a surface area of the first semiconductor die and the second semiconductor die.

27. The stacked semiconductor die assembly of claim 25, further comprising a carrier substrate, the first semiconductor die being disposed on the carrier substrate.

28. The stacked semiconductor die assembly of claim 25, further comprising a mounting adhesive disposed on at least a portion of a region of the upper surface of the first semiconductor die, at least a portion of the mounting adhesive disposed between the at least one adhesive flow control dam and the second semiconductor die.

29. The stacked semiconductor die assembly of claim 28, wherein the mounting adhesive is configured to be thermally conductive having an exposed surface area being heat dissipative.

30. The stacked semiconductor die assembly of claim 29, wherein the mounting adhesive comprises an Ag-filled polymer.

31. The stacked semiconductor die assembly of claim 28, wherein the mounting adhesive is configured to have a coefficient of thermal expansion selected from a group consisting of a coefficient of thermal expansion of the first semiconductor die, a coefficient of thermal expansion of the second semiconductor die, and an average of the coefficients of thermal expansion of the first semiconductor die and the second semiconductor die.

32. The stacked semiconductor die assembly of claim 25, wherein the at least one adhesive flow control dam comprises at least one decoupling capacitor coupon.

33. The stacked semiconductor die assembly of claim 32, wherein an adhesive used to mount the second semiconductor die includes an electrically insulating adhesive.

34. The stacked semiconductor die assembly of claim 25, wherein the at least one adhesive flow control dam comprises a material selected from a group consisting of polyimides, polyamides, and epoxies.

35. The stacked semiconductor die assembly of claim 25, wherein the at least one adhesive flow control dam includes a flow control dam more viscous than an adhesive used to adhesively mount the second semiconductor die.

36. The stacked semiconductor die assembly of claim 25, wherein the first semiconductor die is larger than the second semiconductor die.

37. The stacked semiconductor die assembly of claim 25, wherein the first semiconductor die is substantially the same size as the second semiconductor die.

38. The stacked semiconductor die assembly of claim 25, wherein the first semiconductor die comprises an integrated circuit semiconductor die.

39. The stacked semiconductor die assembly of claim 25, wherein the second semiconductor die comprises an integrated circuit semiconductor die.

40. The stacked semiconductor die assembly of claim 38, wherein the integrated circuit semiconductor die is selected from a group consisting of microprocessors, DRAM, SRAM, FLASH, ADC, FGPA, an active pixel sensor, and an operation amplifier.

41. The stacked semiconductor die assembly of claim 39, wherein the integrated circuit semiconductor die is selected from a group consisting of microprocessors, DRAM, SRAM, FLASH, ADC, FGPA, an active pixel sensor, and an operation amplifier.

42. The stacked semiconductor die assembly of claim 25, wherein the first semiconductor die comprises an interposer.

43. The stacked semiconductor die assembly of claim 25, wherein the second semiconductor die is mounted in an offset fashion relative to the first semiconductor die.

44. The stacked semiconductor die assembly of claim 25, wherein at least a portion of the second semiconductor die is in contact with the at least one adhesive flow control dam.

45. The stacked semiconductor die assembly of claim 44, wherein the at least one adhesive flow control dam is configured to deform upon the contact with the second semiconductor die.

46. The stacked semiconductor die assembly of claim 25, wherein the at least one adhesive flow control dam extends substantially across an entire width of the first semiconductor die.

47. The stacked semiconductor die assembly of claim 25, further comprising at least one wire bond extending from at least one electrical contact of the plurality of electrical contacts.

48. The stacked semiconductor die assembly of claim 47, wherein the at least one adhesive flow control dam is further configured to prevent solder flow onto at least a portion of the second semiconductor die or an extension thereof during wire bonding of at least one electrical contact of the plurality of electrical contacts.

\* \* \* \* \*